United States Patent
Qiu et al.

(10) Patent No.: US 10,516,071 B2
(45) Date of Patent: Dec. 24, 2019

(54) BLISTER-FREE POLYCRYSTALLINE SILICON FOR SOLAR CELLS

(71) Applicant: SUNPOWER CORPORATION, San Jose, CA (US)

(72) Inventors: Taiqing Qiu, Los Gatos, CA (US); Gilles Olav Tanguy Sylvain Poulain, Palaiseau (FR); Perine Jaffrennou, San Francisco, CA (US); Nada Habka, Bourg la Reine (FR); Sergej Filonovich, Orsay (FR)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 239 days.

(21) Appl. No.: 15/419,754

(22) Filed: Jan. 30, 2017

(65) Prior Publication Data

US 2017/0141255 A1    May 18, 2017

Related U.S. Application Data

(63) Continuation of application No. 14/747,874, filed on Jun. 23, 2015, now Pat. No. 9,559,245.

(Continued)

(51) Int. Cl.
*H01L 31/068* (2012.01)
*H01L 31/0368* (2006.01)
(Continued)

(52) U.S. Cl.
CPC .... *H01L 31/0682* (2013.01); *H01L 31/02008* (2013.01); *H01L 31/02167* (2013.01);
(Continued)

(58) Field of Classification Search
CPC .......... H01L 31/0682; H01L 31/03682; H01L 31/02167; H01L 31/02363;
(Continued)

(56) References Cited

U.S. PATENT DOCUMENTS

| 5,028,488 A | 7/1991 | Nakagawa et al. |
| 5,783,365 A | 7/1998 | Tsujita |

(Continued)

FOREIGN PATENT DOCUMENTS

| JP | 2010034463 | 2/2010 |
| KR | 1020140058700 | 5/2014 |

OTHER PUBLICATIONS

First Office Action for Chinese Patent Application No. 2016800182488; dated Dec. 28, 2018; 4 pgs.—with partial English translation of the office action.

(Continued)

*Primary Examiner* — Matthew T Martin
(74) *Attorney, Agent, or Firm* — Schwabe, Williamson & Wyatt, P.C.

(57) ABSTRACT

Described herein are methods of fabricating solar cells. In an example, a method of fabricating a solar cell includes forming an amorphous dielectric layer on the back surface of a substrate opposite a light-receiving surface of the substrate. The method also includes forming a microcrystalline silicon layer on the amorphous dielectric layer by plasma enhanced chemical vapor deposition (PECVD). The method also includes forming an amorphous silicon layer on the microcrystalline silicon layer by PECVD. The method also includes annealing the microcrystalline silicon layer and the amorphous silicon layer to form a homogeneous polycrystalline silicon layer from the microcrystalline silicon layer (Continued)

and the amorphous silicon layer. The method also includes forming an emitter region from the homogeneous polycrystalline silicon layer.

20 Claims, 9 Drawing Sheets

Related U.S. Application Data

(60) Provisional application No. 62/137,193, filed on Mar. 23, 2015.

(51) Int. Cl.
*H01L 31/0236* (2006.01)
*H01L 31/20* (2006.01)
*H01L 31/0216* (2014.01)
*H01L 31/18* (2006.01)
*H01L 31/0224* (2006.01)
*H01L 31/02* (2006.01)

(52) U.S. Cl.
CPC ............ *H01L 31/02363* (2013.01); *H01L 31/022441* (2013.01); *H01L 31/03682* (2013.01); *H01L 31/182* (2013.01); *H01L 31/1804* (2013.01); *H01L 31/1824* (2013.01); *H01L 31/1864* (2013.01); *H01L 31/1872* (2013.01); *Y02E 10/545* (2013.01); *Y02E 10/547* (2013.01); *Y02P 70/521* (2015.11)

(58) Field of Classification Search
CPC .......... H01L 31/02008; H01L 31/1824; H01L 31/022441; H01L 31/1876; H01L 31/1804; H01L 31/1864; H01L 31/182

USPC ........................................................ 136/256
See application file for complete search history.

(56) References Cited

U.S. PATENT DOCUMENTS

| | | | |
|---|---|---|---|
| 8,216,923 B2 | 7/2012 | Bateman et al. | |
| 8,492,253 B2 | 7/2013 | Manning | |
| 9,196,758 B2 | 11/2015 | Rim et al. | |
| 2003/0136517 A1 | 7/2003 | Hori et al. | |
| 2010/0003780 A1 | 1/2010 | Choi et al. | |
| 2010/0015750 A1 | 1/2010 | Shen et al. | |
| 2011/0192993 A1 | 8/2011 | Chun et al. | |
| 2012/0227808 A1 | 9/2012 | Nakayama et al. | |
| 2013/0092081 A1 | 4/2013 | De et al. | |
| 2013/0247965 A1* | 9/2013 | Swanson ........... H01L 31/02167 136/252 |
| 2014/0004651 A1 | 1/2014 | Fogel et al. | |
| 2014/0096821 A1* | 4/2014 | Chen .................. H01L 31/0352 136/256 |
| 2015/0372172 A1* | 12/2015 | Kimoto .............. H01L 31/0747 136/256 |

OTHER PUBLICATIONS

International Preliminary Report on Patentability from PCT/US2016/022507 dated Oct. 5, 2017, 8 pgs.
FAI Pre-Interview Communication from U.S. Appl. No. 14/747,874 dated Jun. 13, 2016, 5 pgs.
International Search Report and Written Opinion from PCT/US2016/022507 dated Jun. 20, 2016, 10 pgs.

* cited by examiner

BLISTER-FREE POLYCRYSTALLINE SILICON FOR SOLAR CELLS

CROSS-REFERENCE TO RELATED APPLICATIONS

This application is a continuation of U.S. patent application Ser. No. 14/747,874, filed on Jun. 23, 2015, which claims the benefit of U.S. Provisional Application No. 62/137,193, filed on Mar. 23, 2015, the entire contents of which are hereby incorporated by reference herein.

TECHNICAL FIELD

Embodiments of the present disclosure are in the field of renewable energy and, in particular, methods of fabricating solar cells, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-type and n-type doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1A:
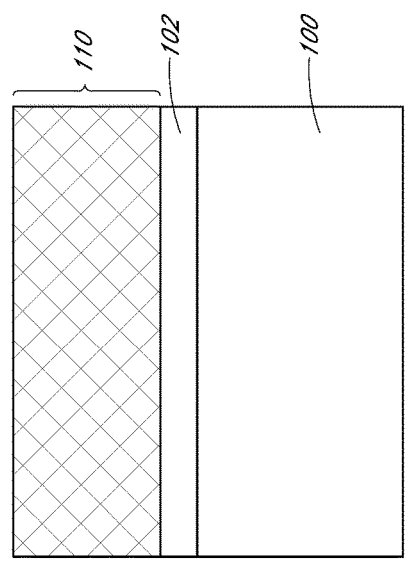
FIGS. 1A and 1B illustrate cross-sectional views of various stages in the fabrication of a solar cell, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard"

describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Methods of fabricating solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Described herein are methods of fabricating solar cells. In one embodiment, a method of fabricating a solar cell includes forming an amorphous dielectric layer on the back surface of a substrate opposite a light-receiving surface of the substrate. The method also includes forming a microcrystalline silicon layer on the amorphous dielectric layer by plasma enhanced chemical vapor deposition (PECVD). The method also includes forming an amorphous silicon layer on the microcrystalline silicon layer by PECVD. The method also includes annealing the microcrystalline silicon layer and the amorphous silicon layer to form a homogeneous polycrystalline silicon layer from the microcrystalline silicon layer and the amorphous silicon layer. The method also includes forming an emitter region from the homogeneous polycrystalline silicon layer.

In another embodiment, a method of fabricating a solar cell with differentiated P-type and N-type architectures includes forming a first microcrystalline silicon layer on a first thin dielectric layer formed on a back surface of a substrate, the first microcrystalline silicon layer formed by plasma enhanced chemical vapor deposition (PECVD). The method also includes forming a P-type amorphous silicon layer on the first microcrystalline silicon layer by PECVD. The method also includes forming an insulating layer on the P-type amorphous silicon layer. The method also includes patterning the insulating layer and the P-type amorphous silicon layer to form P-type amorphous silicon regions having an insulating cap thereon with trenches in the substrate separating the P-type amorphous silicon regions. The method also includes forming a second thin dielectric layer on exposed sides of the P-type amorphous silicon regions and in the trenches. The method also includes forming a second microcrystalline silicon layer on the second thin dielectric layer by PECVD. The method also includes forming an N-type amorphous silicon layer on the second microcrystalline silicon layer by PECVD. The method also includes annealing the first microcrystalline silicon layer and the P-type amorphous silicon regions to form P-type homogeneous polycrystalline silicon regions and annealing the second microcrystalline silicon layer and the N-type amorphous silicon layer to form an N-type homogeneous polycrystalline silicon layer. The method also includes forming conductive contacts to the P-type homogeneous polycrystalline silicon regions and to the N-type homogeneous polycrystalline silicon layer.

In another embodiment, a method of fabricating alternating N-type and P-type emitter regions of a solar cell includes forming an amorphous dielectric layer on the back surface of a substrate opposite a light-receiving surface of the substrate. The method also includes forming a microcrystalline silicon layer on the amorphous dielectric layer by plasma enhanced chemical vapor deposition (PECVD). The method also includes forming an amorphous silicon layer on the microcrystalline silicon layer by PECVD. The method also includes doping first regions of the amorphous silicon layer with P-type dopants, and doping second regions of the amorphous silicon layer with N-type dopants. The method also includes annealing the microcrystalline silicon layer and the amorphous silicon layer to form a homogeneous polycrystalline silicon layer from the microcrystalline silicon layer and the amorphous silicon layer, the homogeneous polycrystalline silicon layer having first regions doped with P-type dopants and second regions doped with N-type dopants. The method also includes forming conductive contacts to the first regions of the homogeneous polycrystalline silicon regions and to the second regions of the homogeneous polycrystalline silicon layer.

In accordance with one or more embodiments described herein, approaches to forming a blister-free polycrystalline silicon layer are disclosed. Applications for such a blister-free polycrystalline silicon layer include, but are not limited to, solar cells having differentiated emitter regions structures (also referred to as hybrid architectures) and back contact solar cells having non-differentiated emitter region structures formed on a thin dielectric layer.

To provide general context, although the polycrystalline silicon layers for such devices have previously been described as possibly being formed by plasma enhanced chemical vapor deposition (PECVD) or low pressure chemical vapor deposition (LPCVD), issues related to PECVD silicon films such as film delamination or film blistering have not been addressed. Embodiments described herein address such blistering issues and may be applicable to one or both of differentiated and non-differentiated cell architectures.

To provide more specific context, previous approaches to forming a polycrystalline silicon layer for emitter region fabrication for a solar cell have involved formation of an amorphous silicon layer as deposited on a tunnel oxide layer by LPCVD. Dopant sources are then formed on the amorphous layer. Subsequently, a high temperature anneal (e.g., 950 degrees Celsius) is performed. The high temperature anneal process may be performed for two purposes: (1) to crystallize amorphous layer into a polycrystalline layer and (2) to diffuse dopants from the dopant sources into the polycrystalline silicon layer to form P-type and N-type regions during the high temperature anneal. One approach to reducing costs for emitter region formation has involved deposition of the amorphous silicon layer by PECVD. However, a key challenge is the blistering of the layer following the high temperature anneal.

Addressing one or more of the above issues, embodiments described herein provide an approach to obtain a blister free layer by PECVD. In one such embodiment, an approach involves first depositing a micro-crystalline silicon (μc-Si) buffer layer followed by deposition of an amorphous silicon (a-Si) layer. The micro-crystalline silicon and the amorphous silicon layer are then annealed to provide a polycrystalline silicon layer. By contrast to previous approaches, embodiments described herein may provide advantages such as, but not limited to, (1) not having to reduce the a-Si deposition rate to limit blistering, maintaining high throughput, (2) not having to modify the thermal anneal operations such as adapting the post deposition thermal process to control $H_2$ outgassing (e.g., control of ramp, temperature), and (3) thicker layers may be deposited with reduced risk of blistering as compared to state-of-the-art approaches.

Embodiments described herein may allow for the development of new architectures with simplified emitter region formation. One or more embodiments involve depositing, in a same PECVD process, a μc-Si layer as a buffer layer followed by deposition of an amorphous silicon layer to avoid blistering. Such embodiments may enable optimization of the bonding between the deposited layers and the substrate to prevent blistering. In an embodiment, the incorporation of a PECVD μc-Si buffer layer between the substrate and the a-Si layer is used to prevent or limit the formation of blisters after a-Si deposition and/or thermal processing treatment. The PECVD buffer layer is deposited under μc-Si-like conditions, e.g., using a high $H_2/SiH_4$ ratio. In a specific embodiment, the PECVD μc-Si buffer layer is composed of polycrystalline silicon with a crystalline fraction above 10% (e.g., preferentially above 50%). The PECVD μc-Si buffer layer may have a thickness approximately between 2 and 50 nanometers, but embodiments are not so limited. In an embodiment, the substrate surface onto which the PECVD μc-Si buffer layer is deposited is amorphous (e.g., thin a-Si, $SiO_2$, $AlO_x$, $SiN_x$), and preferentially $SiO_2$ atop crystalline silicon. The PECVD μc-Si buffer layer may be intrinsic or P-type or N-type doped, depending on the application.

Figure 1B:
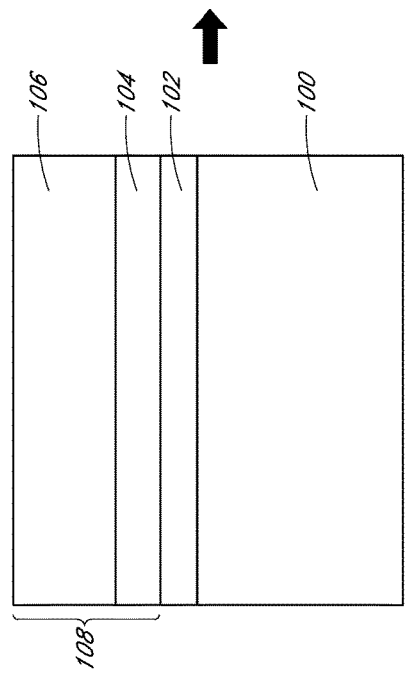
Figure 2:
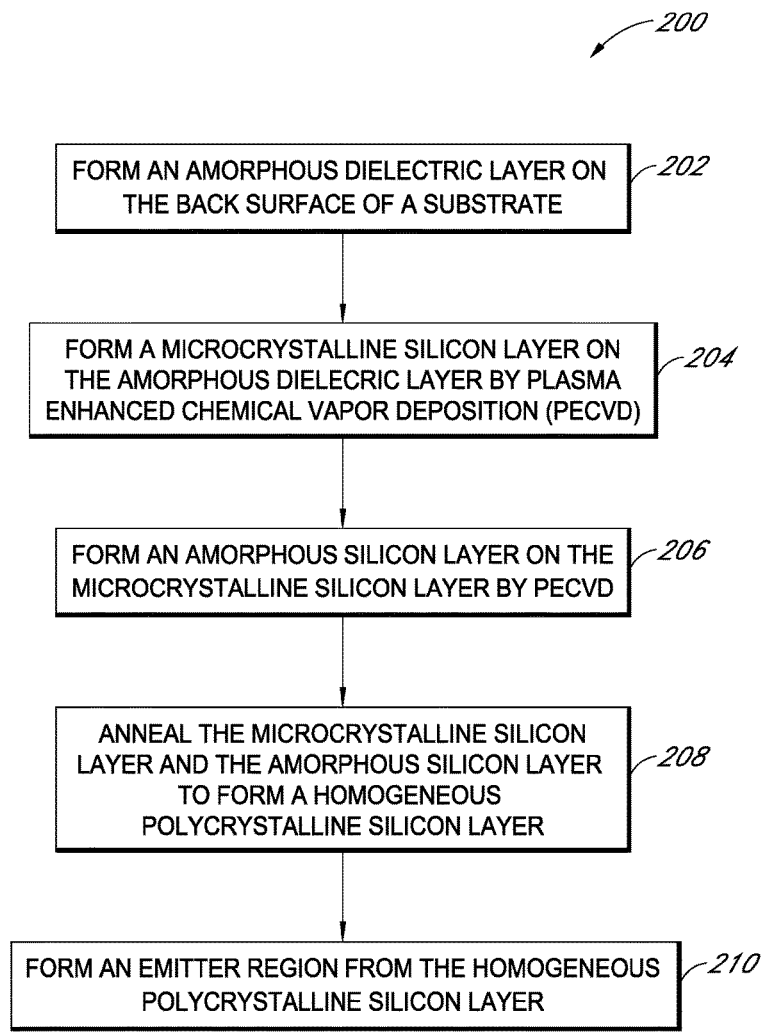
FIG. 2 is a flowchart listing operations in a method of fabricating a solar cell as corresponding to FIGS. 1A and 1B, in accordance with an embodiment of the present disclosure.

In a general example of blister-free polycrystalline silicon deposition processes involving deposition of a thin microcrystalline (μc-Si) layer prior to deposition of an a-Si layer to prevent the blistering effect, even after annealing at high temperature, FIGS. 1A and 1B illustrate cross-sectional views of various stages in the fabrication of a solar cell, in accordance with an embodiment of the present disclosure. FIG. 2 is a flowchart 200 listing operations in a method of fabricating a solar cell as corresponding to FIGS. 1A and 1B, in accordance with an embodiment of the present disclosure.

Referring to FIG. 1A and to corresponding operation 202 of flowchart 200, a method of fabricating a solar cell includes forming an amorphous dielectric layer 102 on the back surface of a substrate 100, opposite a light-receiving surface of the substrate. In an embodiment, the substrate 100 is a monocrystalline substrate, such as a monocrystalline silicon substrate, and forming the amorphous dielectric layer 102 involves oxidizing the back surface of the substrate 100.

Referring again to FIG. 1A and now to corresponding operation 204 of flowchart 200, the method of fabricating a solar cell also includes forming a microcrystalline silicon layer 104 on the amorphous dielectric layer 102 by plasma enhanced chemical vapor deposition (PECVD).

In an embodiment, forming the microcrystalline silicon layer 104 involves depositing microcrystalline silicon by PECVD at a deposition rate approximately in the range of 10-40 nanometers per minute. In an embodiment, the microcrystalline silicon layer 104 is formed to a thickness approximately in the range of 2-50 nanometers.

Referring again to FIG. 1A and now to corresponding operation 206 of flowchart 200, the method of fabricating a solar cell also includes forming an amorphous silicon layer 106 on the microcrystalline silicon layer 104 by PECVD. The amorphous silicon layer 106 and the microcrystalline silicon layer 104 form a silicon stack 108.

In an embodiment, forming the microcrystalline silicon layer 104 by PECVD and the amorphous silicon layer 106 by PECVD involves forming the microcrystalline silicon layer 104 and the amorphous silicon layer 106 in a single pass of a PECVD chamber. In an embodiment, forming the amorphous silicon layer 106 involves depositing amorphous silicon by PECVD at a deposition rate approximately in the range of 50-400 nanometers per minute. In an embodiment, forming the amorphous silicon layer 106 involves forming an N-type or P-type amorphous silicon layer by flowing phosphine or diborane, respectively, during formation of the amorphous silicon layer 106 by PECVD. In an embodiment, the amorphous silicon layer 106 is formed to a thickness approximately in the range of 50-400 nanometers. In an embodiment, the amorphous silicon layer 106 is formed by depositing amorphous silicon by PECVD at a deposition temperature below approximately 350 degrees Celsius.

Referring to FIG. 1B and to corresponding operation 208 of flowchart 200, the method of fabricating a solar cell also includes annealing the microcrystalline silicon layer 104 and the amorphous silicon layer 106 (i.e., annealing the silicon stack 108) to form a homogeneous polycrystalline silicon layer 110 from the microcrystalline silicon layer 104 and the amorphous silicon layer 106.

In an embodiment, annealing the microcrystalline silicon layer 104 and the amorphous silicon layer 106 involves heating at a temperature above approximately 400 degrees Celsius for a duration of approximately 10 minutes. In an embodiment, annealing the microcrystalline silicon layer 104 and the amorphous silicon layer 106 to form the homogeneous polycrystalline silicon layer 110 involves forming a blister-free homogeneous polycrystalline silicon layer.

Referring to operation 210 of flowchart 200, in an embodiment, the method of fabricating a solar cell also includes forming an emitter region from the homogeneous polycrystalline silicon layer 110. Exemplary emitter region architectures are described below.

Figure 3:
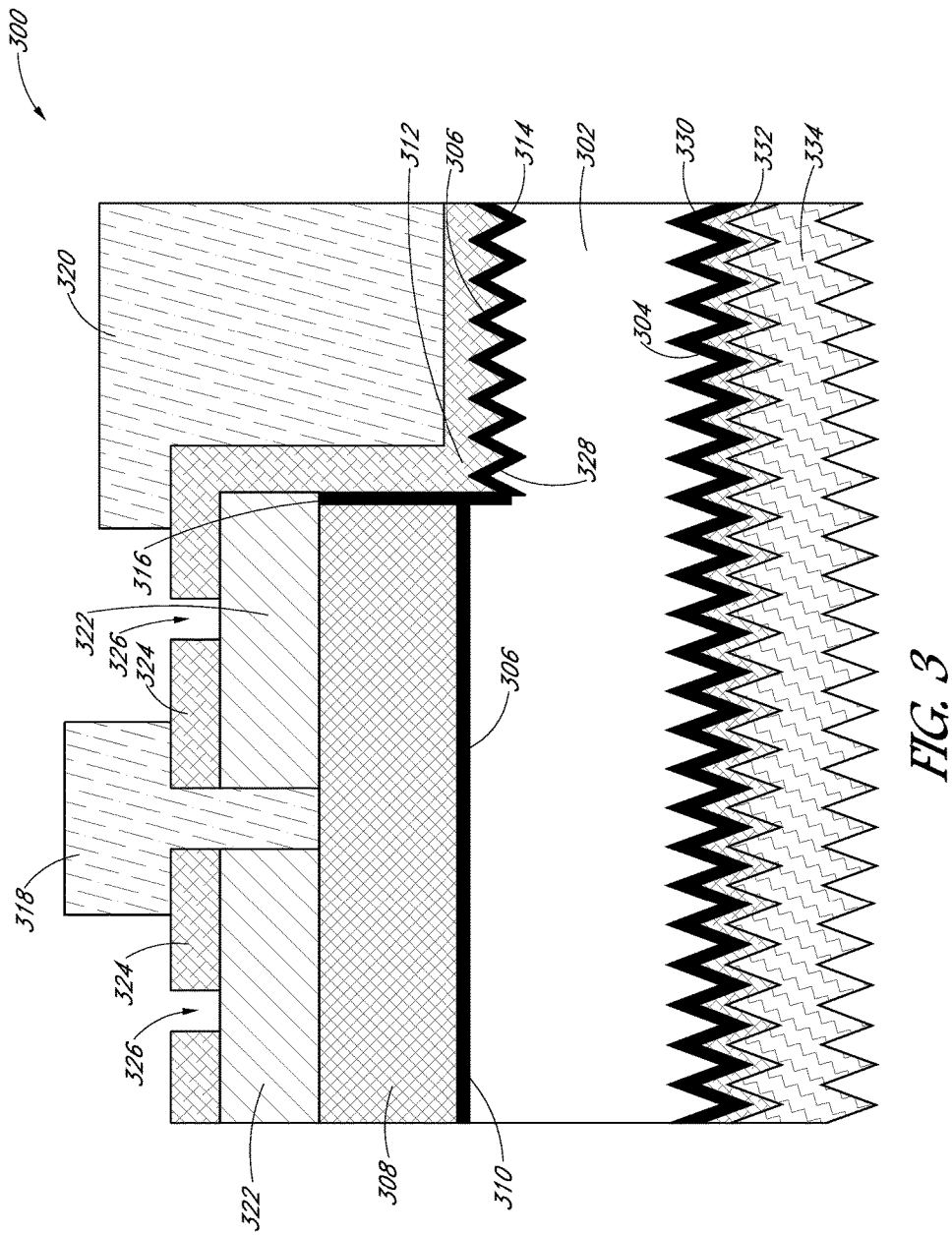
FIG. 3 illustrates a cross-sectional view of a portion of a back contact solar cell, in accordance with an embodiment of the present disclosure.

In a first example of an application of forming a blister-free polycrystalline silicon layer, FIG. 3 illustrates a cross-sectional view of a portion of a back contact solar cell 300, in accordance with an embodiment of the present disclosure. The solar cell 300 includes a substrate 302 having a light-receiving surface 304 and a back surface 306. A first polycrystalline silicon emitter region 308 of a first conductivity type is disposed on a first thin dielectric layer 310 disposed on the back surface 306 of the substrate 302. A second polycrystalline silicon emitter region 312 of a second, different, conductivity type is disposed on a second thin dielectric layer 314 disposed on the back surface 306 of the substrate 302. A third thin dielectric layer 316 is disposed laterally directly between the first 308 and second 312 polycrystalline silicon emitter regions. A first conductive contact structure 318 is disposed on the first polycrystalline silicon emitter region 308. A second conductive contact structure 320 is disposed on the second polycrystalline silicon emitter region 312. In an embodiment, the polycrystalline silicon material of the first polycrystalline silicon emitter region 308 or the second polycrystalline silicon emitter region 312, or both, is fabricated using a blister-free polycrystalline silicon layer deposition process such as described in association with FIGS. 1A, 1B and 2.

Referring again to FIG. 3, in an embodiment, the solar cell 300 further includes an insulator layer 322 disposed on the first polycrystalline silicon emitter region 308. The first conductive contact structure 318 is disposed through the insulator layer 322. Additionally, a portion of the second polycrystalline silicon emitter region 312 overlaps the insulator layer 322 but is separate from the first conductive contact structure 318. In an embodiment, an additional polycrystalline silicon layer 324 of the second conductivity type is disposed on the insulator layer 322, and the first conductive contact structure 318 is disposed through the polycrystalline silicon layer 324 of the second conductivity type and through the insulator layer 322, as is depicted in FIG. 3. As described in greater detail below, in one such embodiment, the additional polycrystalline silicon layer 324 and the second polycrystalline silicon emitter region 312 are formed from a same layer that is blanket deposited and then scribed to provide scribe lines 326 therein.

Referring again to FIG. 3, in an embodiment, the solar cell 300 further includes a recess 328 disposed in the back surface 306 of the substrate 302. The second polycrystalline silicon emitter region 312 and the second thin dielectric layer 314 are disposed in the recess 328. In one such embodiment, the recess 328 has a texturized surface, and the second polycrystalline silicon emitter region 312 and the second thin dielectric layer 314 are conformal with the texturized surface, as is depicted in FIG. 3. In an embodiment, then, the first polycrystalline silicon emitter region 308 and the first thin dielectric layer 310 are disposed on a flat portion of the back surface 306 of the substrate 302, and the second polycrystalline silicon emitter region 312 and the second thin dielectric layer 314 are disposed on a texturized portion of the back surface 306 of the substrate, as is depicted in FIG. 3. It is to be appreciated, however, that other embodiments may not include a texturized surface, or may not include a recess altogether.

Referring again to FIG. 3, in an embodiment, the solar cell 300 further includes a fourth thin dielectric layer 330 disposed on the light-receiving surface 304 of the substrate 302. A polycrystalline silicon layer 332 of the second conductivity type is disposed on the fourth thin dielectric layer 332. An anti-reflective coating (ARC) layer 334, such as a layer of silicon nitride, is disposed on the polycrystalline silicon layer 332. In one such embodiment, as described in greater detail below, the fourth thin dielectric layer 332 is formed by essentially the same process used to form the second thin dielectric layer 314, and the polycrystalline silicon layer 332 is formed by essentially the same process used to form the second polycrystalline silicon emitter region 312.

In an embodiment, the first polycrystalline silicon emitter region 308 is a P-type polycrystalline silicon emitter region. The second polycrystalline silicon emitter region 312 is an N-type polycrystalline silicon emitter region. The substrate is an N-type monocrystalline silicon substrate. In an embodiment, the first thin dielectric layer 310, the second thin dielectric layer 314 and the third thin dielectric layer 316 include silicon dioxide. However, in another embodiment, the first thin dielectric layer 310 and the second thin dielectric layer 314 include silicon dioxide, while the third thin dielectric layer 316 includes silicon nitride. In an embodiment, insulator layer 322 includes silicon dioxide.

In an embodiment, the first conductive contact structure 318 and the second conductive contact structure 320 each include an aluminum-based metal seed layer disposed on the first 308 and second 312 polycrystalline silicon emitter regions, respectively. In one embodiment, each of the first conductive contact structure 318 and the second conductive contact structure 320 further includes a metal layer, such as a copper layer, disposed on the aluminum-based metal seed layer.

Figure 4:
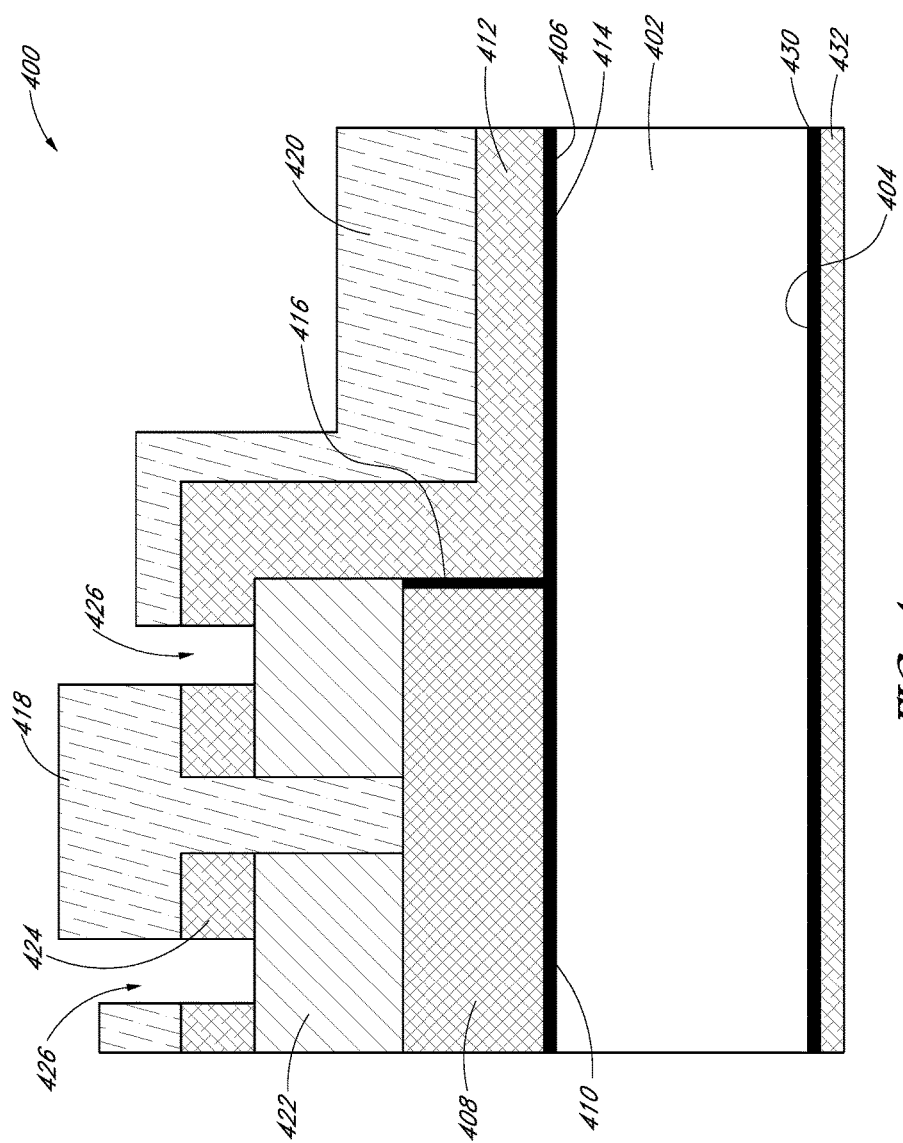
FIG. 4 illustrates a cross-sectional view of a portion of a back contact solar cell, in accordance with another embodiment of the present disclosure.

In a second example of an application of forming a blister-free polycrystalline silicon layer, FIG. 4 illustrates a cross-sectional view of a portion of a back contact solar cell 400, in accordance with another embodiment of the present disclosure. The solar cell 400 includes a substrate 402 having a light-receiving surface 404 and a back surface 406. A first polycrystalline silicon emitter region 408 of a first conductivity type is disposed on a first thin dielectric layer 410 disposed on the back surface 406 of the substrate 402. A second polycrystalline silicon emitter region 412 of a second, different, conductivity type is disposed on a second thin dielectric layer 414 disposed on the back surface 406 of the substrate 402. A third thin dielectric layer 416 is disposed laterally directly between the first 408 and second 412 polycrystalline silicon emitter regions. A first conductive contact structure 418 is disposed on the first polycrystalline silicon emitter region 408. A second conductive contact structure 420 is disposed on the second polycrystalline silicon emitter region 412. In an embodiment, the polycrystalline silicon material of the first polycrystalline silicon emitter region 408 or the second polycrystalline silicon emitter region 412, or both, is fabricated using a blister-free polycrystalline silicon layer deposition process such as described in association with FIGS. 1A, 1B and 2.

In accordance with an embodiment of the present disclosure, the first 418 and second 420 conductive contact structures each include a metal silicide layer disposed on the first 408 and second 412 polycrystalline silicon emitter regions, respectively. In one such embodiment, the metal silicide layer is formed by consuming exposed regions of the first 408 and second 412 polycrystalline silicon emitter regions in a silicidation process. As such, all exposed top surfaces of the first 408 and second 412 polycrystalline silicon emitter regions, and any other exposed silicon surfaces, are metalized, as is depicted in FIG. 4. In an embodiment, the first 418 and second 420 conductive contact structures each further includes a metal layer (such as copper) disposed on the metal silicide layer. In a particular embodiment, the metal silicide layer includes a material such as, but not limited to, titanium silicide ($TiSi_2$), cobalt silicide ($CoSi_2$), tungsten silicide ($WSi_2$), or nickel silicide (NiSi or $NiSi_2$).

Referring again to FIG. 4, in an embodiment, the solar cell 400 further includes an insulator layer 422 disposed on the first polycrystalline silicon emitter region 408. The first conductive contact structure 418 is disposed through the insulator layer 422. Additionally, a portion of the second polycrystalline silicon emitter region 412 overlaps the insulator layer 422 but is separate from the first conductive contact structure 418. In an embodiment, an additional polycrystalline silicon layer 424 of the second conductivity type is disposed on the insulator layer 422, and the first conductive contact structure 418 is disposed through the polycrystalline silicon layer 424 of the second conductivity type and through the insulator layer 422, as is depicted in FIG. 4. However, in contrast to FIG. 3, the entire top surface of the polycrystalline silicon layer 424 is metalized. As described in greater detail below, in one such embodiment, the additional polycrystalline silicon layer 424 and the second polycrystalline silicon emitter region 412 are formed from a same layer that is blanket deposited and then scribed to provide scribe lines 426 therein.

Referring again to FIG. 4, in an embodiment, the back surface 406 of the substrate 402 is essentially entirely flat. However, in another embodiment, the second polycrystalline silicon emitter region 412 and the second thin dielectric layer 414 are disposed in a recess, as was described in association with FIG. 3. In one such embodiment, the recess has a texturized surface, and the second polycrystalline silicon emitter region 412 and the second thin dielectric layer 414 are conformal with the texturized surface.

Referring again to FIG. 4, in an embodiment, the solar cell 400 further includes a fourth thin dielectric layer 430 disposed on the light-receiving surface 404 of the substrate 402. A polycrystalline silicon layer 432 of the second conductivity type is disposed on the fourth thin dielectric layer 432. Although not depicted, in an embodiment, an anti-reflective coating (ARC) layer, such as a layer of silicon nitride, is disposed on the polycrystalline silicon layer 432. In one such embodiment, as described in greater detail below, the fourth thin dielectric layer 432 is formed by essentially the same process used to form the second thin dielectric layer 414, and the polycrystalline silicon layer 430 is formed by essentially the same process used to form the second polycrystalline silicon emitter region 412.

In an embodiment, the substrate 402, the first polycrystalline silicon emitter region 408, the second polycrystalline silicon emitter region 412 and the various dielectric layers are similar or essentially the same as described above for the substrate 302, the first polycrystalline silicon emitter region 308, the second polycrystalline silicon emitter region 312 and the various dielectric layers in association with FIG. 3.

Figure 5:
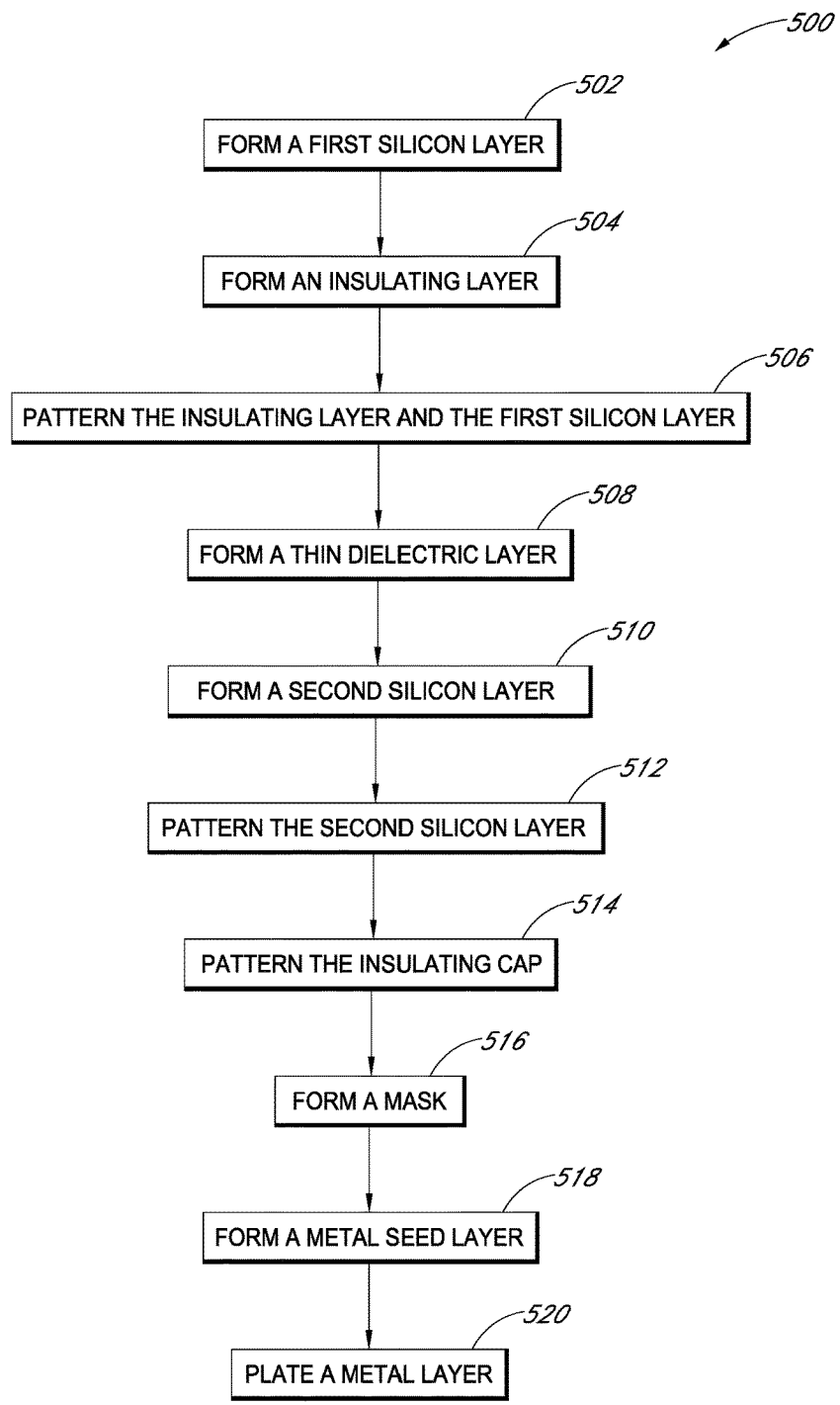
FIG. 5 is a flowchart listing operations in a method of fabricating a solar cell as corresponding to FIGS. 6A-6F, in accordance with an embodiment of the present disclosure.

Also disclosed herein are methods of fabricating solar cells. In an exemplary process flow, FIGS. 6A-6F illustrate cross-sectional views of various stages in the fabrication of a solar cell, in accordance with an embodiment of the present disclosure. FIG. 5 is a flowchart 500 listing operations in a method of fabricating a solar cell as corresponding to FIGS. 6A-6F, in accordance with an embodiment of the present disclosure.

Figure 6A:
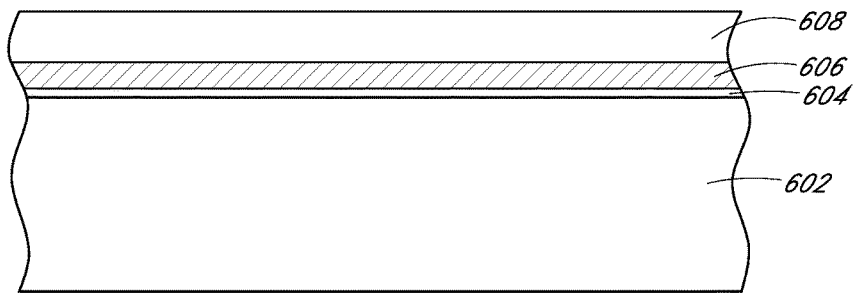
FIGS. 6A-6F illustrate cross-sectional views of various stages in the fabrication of a solar cell, in accordance with an embodiment of the present disclosure.

Referring to FIG. 6A and corresponding operation 502 of flowchart 500, a method of fabricating alternating N-type and P-type emitter regions of a solar cell involves forming a first silicon layer 606 of a first conductivity type on a first thin dielectric layer 604 formed on a back surface of a substrate 602.

In an embodiment, the substrate 602 is a monocrystalline silicon substrate, such as a bulk single crystalline N-type doped silicon substrate. It is to be understood, however, that substrate 602 may be a layer, such as a multi-crystalline silicon layer, disposed on a global solar cell substrate. In an embodiment, the first thin dielectric layer 604 is a thin oxide layer such as a tunnel dielectric silicon oxide layer having a thickness of approximately 2 nanometers or less.

In an embodiment, the first silicon layer 606 is a polycrystalline silicon layer that is doped to have the first conductivity type either through in situ doping, post deposition implanting, or a combination thereof. In an embodiment, the first silicon layer 606 is fabricated using a blister-free polycrystalline silicon layer deposition process such as described in association with FIGS. 1A, 1B and 2. In a specific embodiment, the second conductivity type is P-type (e.g., formed using boron impurity atoms).

Referring again to FIG. 6A and now to corresponding operation 504 of flowchart 500, an insulating layer 608 is formed on the first silicon layer 606. In an embodiment the insulating layer 608 includes silicon dioxide.

Figure 6B:
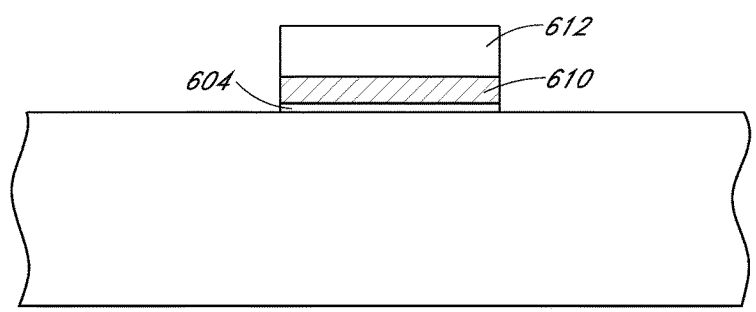

Referring to FIG. 6B and corresponding operation 506 of flowchart 500, the insulating layer 608 and the first silicon layer 606 are patterned to form a first silicon region 610 of the first conductivity type having an insulating cap 612 thereon. In an embodiment, a lithographic or screen print masking and subsequent etch process is used to pattern the insulating layer 608 and the first silicon layer 606. In another embodiment, a laser ablation process (e.g., direct write) is used to pattern the insulating layer 608 and the first silicon layer 606. In either case, in one embodiment, the first thin dielectric layer 604 is also patterned in the process, as is depicted in FIG. 6B.

Figure 6C:
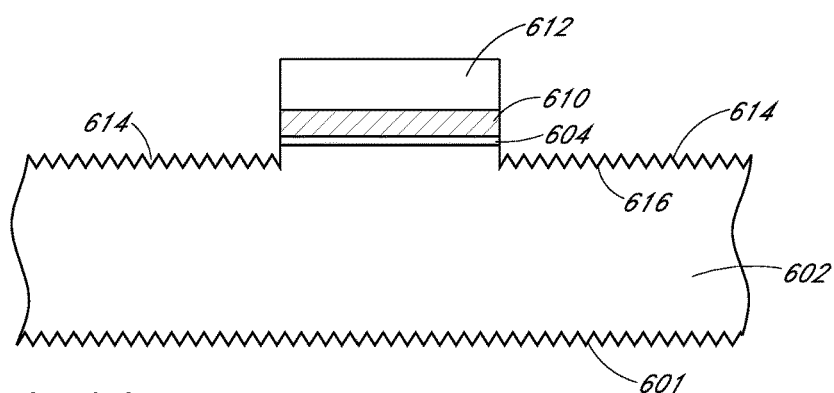

Referring to FIG. 6C, optionally, recesses 614 may be formed in the substrate 602 during (or subsequent to) the patterning of the insulating layer 608 and the first silicon layer 606. Furthermore, in one embodiment, the surfaces 616 of the recesses 614 are texturized. In a same or similar process, a light receiving surface 601 of the substrate 602 may also be texturized, as is depicted in FIG. 6C. In an embodiment, a hydroxide-based wet etchant is used to form at least a portion of the recesses 614 and/or to texturize exposed portions of the substrate 602. A texturized surface may be one which has a regular or an irregular shaped surface for scattering incoming light, decreasing the amount of light reflected off of the light-receiving and/or exposed surfaces of the solar cell. It is to be appreciated, however, that the texturizing of the back surface and even the recess formation may be omitted from the process flow.

Figure 6D:
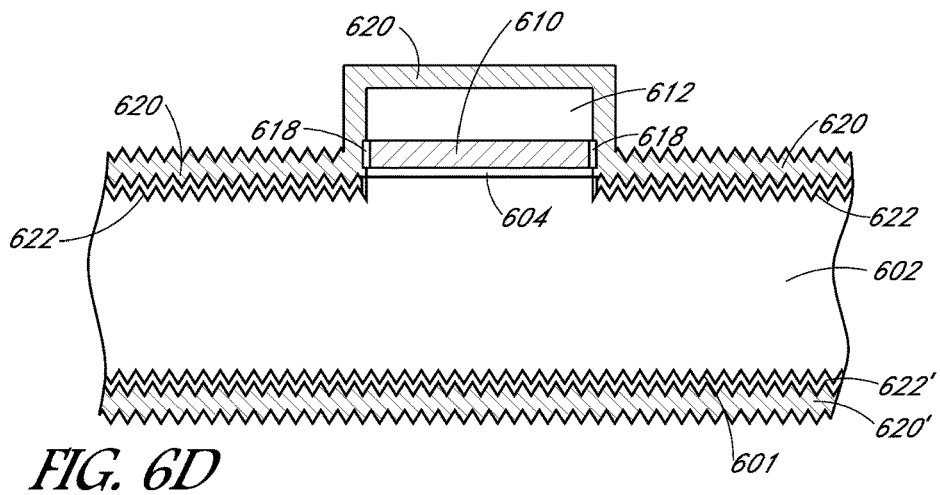

Referring to FIG. 6D and corresponding operation 508 of flowchart 500, a second thin dielectric layer 618 is formed on exposed sides of the first silicon regions 610. In an embodiment, the second thin dielectric layer 618 is formed in an oxidation process and is a thin oxide layer such as a tunnel dielectric silicon oxide layer having a thickness of approximately 2 nanometers or less. In another embodiment, the second thin dielectric layer 618 is formed in a deposition process and is a thin silicon nitride layer or silicon oxynitride layer. As is explained below in more detail, in one embodiment, the dielectric layers (e.g., the first thin dielectric layer 604, the second thin dielectric layer 618) are amorphous dielectric layers formed by oxidation of a silicon substrate.

Referring again to FIG. 6D and now to corresponding operation 510 of flowchart 500, a second silicon layer 620 of a second, different, conductivity type is formed on a third thin dielectric layer 622 formed on the back surface of the substrate 602, and on the second thin dielectric layer 618 and the insulating cap 612 of the first silicon regions 610. Corresponding thin dielectric layer 622' and second silicon layer 620' of the second conductivity type may also be formed on the light-receiving surface 601 of the substrate 602, is same or similar process operations, as is depicted in FIG. 6D. Additionally, although not depicted, an ARC layer may be formed on the corresponding second silicon layer 620', as was described in association with FIG. 3.

In an embodiment, the third thin dielectric layer 622 is formed in an oxidation process and is a thin oxide layer such as a tunnel dielectric silicon oxide layer having a thickness of approximately 2 nanometers or less. In an embodiment, the second silicon layer 620 is a polycrystalline silicon layer that is doped to have the second conductivity type either through in situ doping, post deposition implanting, or a combination thereof. In an embodiment, the second silicon layer 620 is fabricated using a blister-free polycrystalline silicon layer deposition process such as described in association with FIGS. 1A, 1B and 2. In a specific embodiment, the second conductivity type is N-type (e.g., formed using phosphorus atoms or arsenic impurity atoms).

Figure 6E:
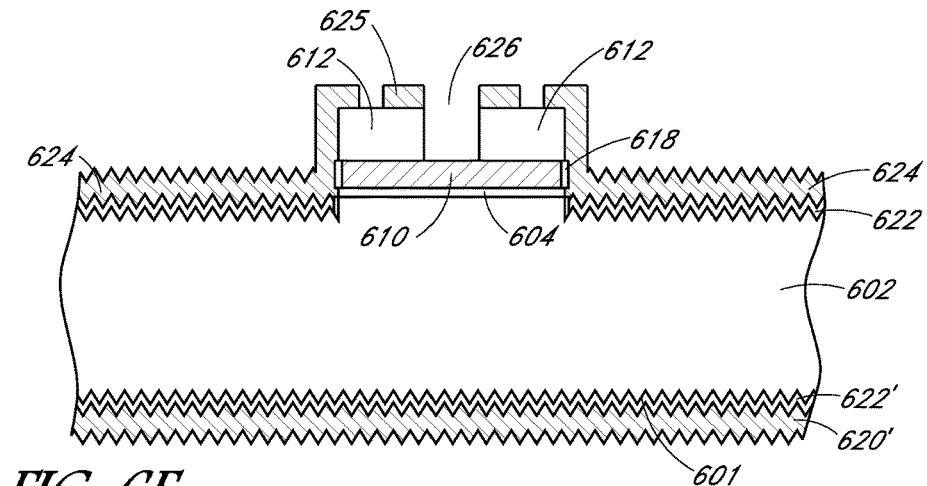

Referring to FIG. 6E and corresponding operation 512 of flowchart 500, the second silicon layer 620 is patterned to form isolated second silicon regions 624 of the second conductivity type and to form a contact opening 626 in regions of the second silicon layer 620 above the insulating cap 612 of the first silicon regions 610. In an embodiment, discrete regions of silicon 625 may remain as an artifact of the patterning process. In an embodiment, a laser ablation process is used to pattern the second silicon layer 620.

Referring again to FIG. 6E and now to corresponding operation 514 of flowchart 500, the insulating cap 612 is patterned through the contact openings 626 to expose portions of the first silicon regions 610. In an embodiment, the insulating cap 612 is patterned using a laser ablation process. For example, in one embodiment, a first laser pass is used to pattern the second silicon layer 620, including forming contact opening 626. A second laser pass in the same location as contact opening 626 is the used to pattern the insulating cap 612.

Figure 6F:
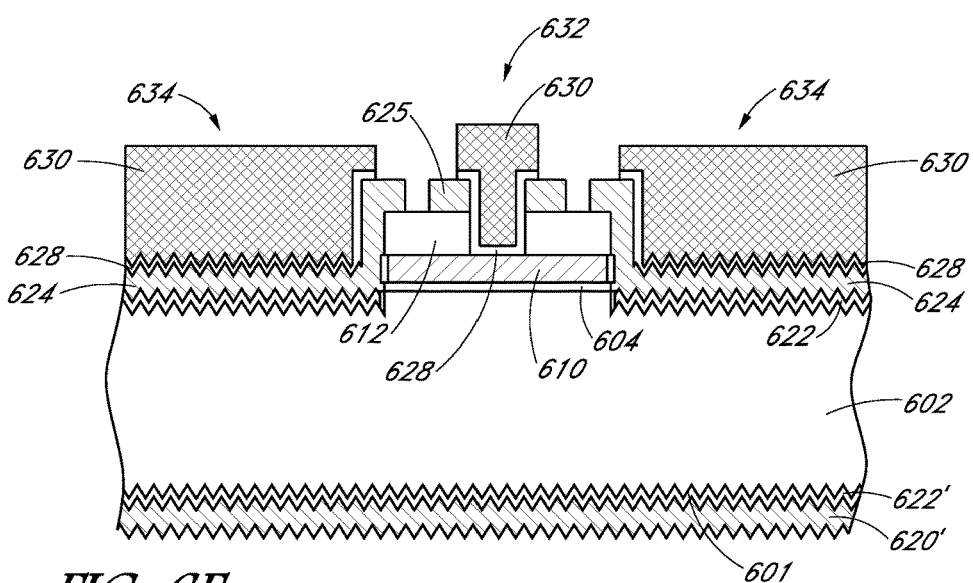

Referring to FIG. 6F, a metal seed layer 628 is formed on the exposed portions of the first silicon regions 610 and on the isolated second silicon regions 624. A metal layer 630 is plated on the metal seed layer to form conductive contacts 632 and 634, respectively, for the first silicon regions 610 and the isolated second silicon regions 624. In an embodiment, the metal seed layer 628 is an aluminum-based metal seed layer, and the metal layer 630 is a copper layer. In an embodiment, a mask is first formed to expose only the exposed portions of the first silicon regions 610 and the isolated second silicon regions 624 in order to direct the metal seed layer 628 formation to restricted locations.

Figure 7A:
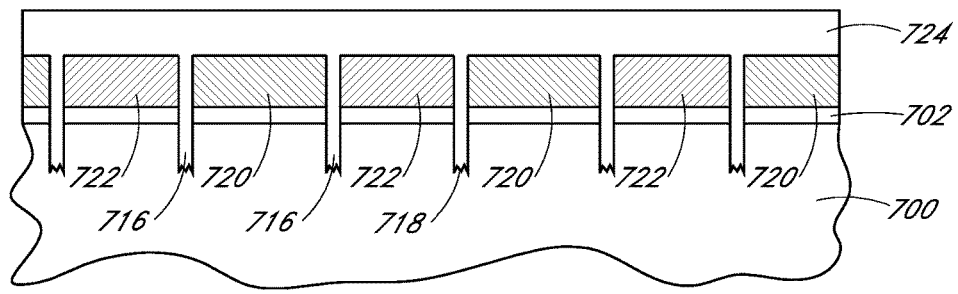
FIGS. 7A-7C illustrate cross-sectional views of various processing operations in a method of fabricating solar cells using a blister-free polycrystalline silicon layer deposition process, in accordance with an embodiment of the present disclosure.
Figure 7B:
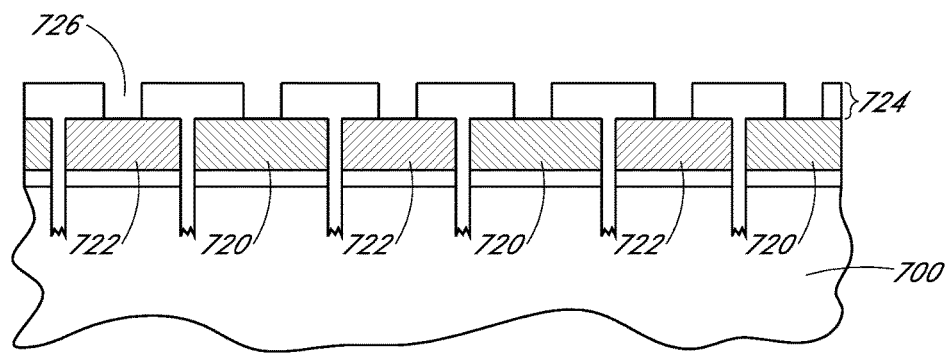
Figure 7C:
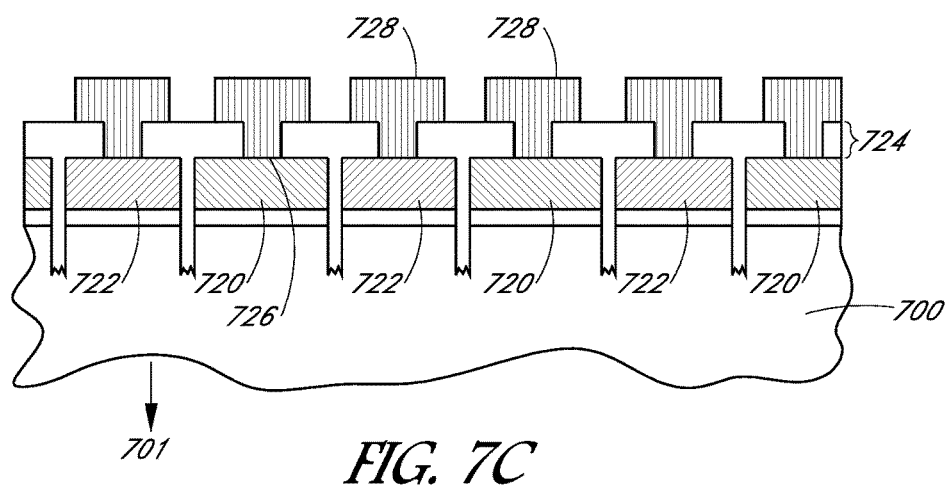

In a third example of an application of forming a blister-free polycrystalline silicon layer, FIGS. 7A-7C illustrate cross-sectional views of various processing operations in a method of fabricating solar cells using a blister-free polycrystalline silicon layer deposition process, in accordance with an embodiment of the present disclosure. Referring to FIG. 7A, a method of forming contacts for a back-contact solar cell includes forming a thin dielectric layer 702 on a substrate 700.

In an embodiment, the thin dielectric layer 702 is composed of silicon dioxide and has a thickness approximately in the range of 5-50 Angstroms. In one embodiment, the thin dielectric layer 702 ultimately performs as a tunneling oxide layer in a functioning solar cell. The dielectric layer 702 may be formed via a similar, or the same, process as the dielectric layers described above. For example, the dielectric layer 702 may be an amorphous dielectric layer. In an embodiment, substrate 700 is a bulk single-crystal substrate, such as an N-type doped single crystalline silicon substrate. However, in an alternative embodiment, substrate 700 includes a polycrystalline silicon layer disposed on a global solar cell substrate.

Referring again to FIG. 7A, N-type doped polysilicon regions 720 and P-type doped polysilicon regions 722 are formed on the dielectric layer 702. In an embodiment, the N-type doped polysilicon regions 720 and P-type doped polysilicon regions 722 are fabricated using a blister-free polycrystalline silicon layer deposition process such as described in association with FIGS. 1A, 1B and 2. Trenches 716 may be formed between N-type doped polysilicon regions 720 and P-type doped polysilicon regions 722. Portions of the trenches 716 can be texturized to have textured features 718, as is also depicted in FIG. 7A.

Referring again to FIG. 7A, an insulating layer 724 is formed above the plurality of N-type doped polysilicon regions 720, the plurality of P-type doped polysilicon regions 722, and the portions of substrate 700 exposed by trenches 716. In one embodiment, a lower surface of the insulating layer 724 is formed conformal with the plurality of N-type doped polysilicon regions 720, the plurality of P-type doped polysilicon regions 722, and the exposed portions of substrate 700, while an upper surface of insulating layer 724 is substantially flat, as depicted in FIG. 7A.

Referring to FIG. 7B, a plurality of contact openings 726 are formed in the insulating layer 724. The plurality of contact openings 726 provide exposure to the plurality of N-type doped polysilicon regions 720 and to the plurality of P-type doped polysilicon regions 722. In one embodiment, the plurality of contact openings 726 is formed by laser ablation. In one embodiment, the contact openings 726 to the N-type doped polysilicon regions 720 have substantially the same height as the contact openings to the P-type doped polysilicon regions 722, as depicted in FIG. 7B.

Referring to FIG. 7C, the method of forming contacts for the back-contact solar cell further includes forming conductive contacts 728 in the plurality of contact openings 726 and coupled to the plurality of N-type doped polysilicon regions 720 and to the plurality of P-type doped polysilicon regions 722. In an embodiment, conductive contacts 728 are formed on or above a surface of a bulk N-type silicon substrate 700 opposing a light receiving surface 701 of the bulk N-type silicon substrate 700. In a specific embodiment, the conductive contacts are formed on regions (722/720) above the surface of the substrate 700, as depicted in FIG. 7C. The fabrication of the conductive contacts can involve use of one or more sputtered conductive layers, as described above.

With more general reference to all embodiments described above, in accordance with an embodiment of the present disclosure, a method of fabricating a solar cell involves forming an amorphous dielectric layer on the back surface of a substrate opposite a light-receiving surface of the substrate. In one embodiment, the substrate is a monocrystalline substrate, and forming the amorphous dielectric layer may involve oxidizing the back surface of the substrate.

In an embodiment, a method of fabricating a solar cell further involves forming a microcrystalline silicon layer on the amorphous dielectric layer by plasma enhanced chemical vapor deposition (PECVD). The method further involves forming an amorphous silicon layer on the microcrystalline silicon layer by PECVD and annealing the microcrystalline silicon layer and the amorphous silicon layer to form a homogeneous polycrystalline silicon layer from the microcrystalline silicon layer and the amorphous silicon layer. The method also involves forming an emitter region from the homogeneous polycrystalline silicon layer.

Regarding the microcrystalline silicon layer and the amorphous silicon layer, formation of the microcrystalline silicon layer by PECVD and the amorphous silicon layer by PECVD may involve forming the microcrystalline silicon layer and the amorphous silicon layer in a single pass of a PECVD chamber. In one embodiment, forming the microcrystalline silicon layer involves depositing microcrystalline silicon by PECVD at a deposition rate approximately in the range of 10-40 nanometers per minute. Forming the amorphous silicon layer may involve depositing amorphous silicon by PECVD at a deposition rate approximately in the range of 50-400 nanometers per minute.

Forming the amorphous silicon layer may involve forming an N-type or P-type amorphous silicon layer by flowing phosphine or diborane, respectively, during the forming the amorphous silicon layer by PECVD. Annealing the microcrystalline silicon layer and the amorphous silicon layer may involve heating at a temperature of greater than approximately 400 degrees Celsius for a duration of approximately 10 minutes. According to one embodiment, forming the microcrystalline silicon layer involves forming the microcrystalline silicon layer to a thickness approximately in the range of 2-50 nanometers, and forming the amorphous silicon layer involves forming the amorphous silicon layer to a thickness approximately in the range of 50-400 nanometers. Annealing the microcrystalline silicon layer and the amorphous silicon layer to form the homogeneous polycrystalline silicon layer may include forming a blister-free homogeneous polycrystalline silicon layer.

In an embodiment, for P-type and N-type differentiation, formation of first and second microcrystalline silicon layers may involve depositing microcrystalline silicon by PECVD at a deposition rate approximately in the range of 10-40 nanometers per minute. Formation of the P-type amorphous silicon layer and the N-type amorphous silicon layer may involve depositing amorphous silicon by PECVD at a deposition rate approximately in the range of 50-400 nanometers per minute. Annealing may be performed by heating at a temperature of greater than approximately 400 degrees Celsius for a duration of approximately 10 minutes.

In another general embodiment, a method of fabricating alternating N-type and P-type emitter regions of a solar cell involves forming a microcrystalline silicon layer on the amorphous dielectric layer by plasma enhanced chemical vapor deposition (PECVD). The method also involves forming an amorphous silicon layer on the microcrystalline silicon layer by PECVD, and doping first regions of the amorphous silicon layer with P-type dopants, and doping second regions of the amorphous polycrystalline silicon layer with N-type dopants. The method further involves annealing the microcrystalline silicon layer and the amorphous silicon layer to form a homogeneous polycrystalline silicon layer from the microcrystalline silicon layer and the amorphous silicon layer. The homogeneous polycrystalline silicon layer has first regions doped with P-type dopants and second regions doped with N-type dopants. The method also involves forming conductive contacts to the first regions of the homogeneous polycrystalline silicon regions and to the second regions of the homogeneous polycrystalline silicon layer.

In one such embodiment, forming the microcrystalline silicon layer by PECVD and the amorphous silicon layer by PECVD involves forming the microcrystalline silicon layer and the amorphous silicon layer in a single pass of a PECVD chamber. Forming the microcrystalline silicon layer may involve depositing microcrystalline silicon by PECVD at a deposition rate approximately in the range of 10-40 nanometers per minute. Forming the amorphous silicon layer may involve depositing amorphous silicon by PECVD at a deposition rate approximately in the range of 50-400 nanometers per minute.

In one embodiment, annealing the microcrystalline silicon layer and the amorphous silicon layer involves heating at a temperature of greater than approximately 400 degrees Celsius for a duration of approximately 10 minutes. Forming the microcrystalline silicon layer may involve forming the microcrystalline silicon layer to a thickness approximately in the range of 2-50 nanometers, and forming the amorphous silicon layer may involve forming the amorphous silicon layer to a thickness approximately in the range of 50-400 nanometers. Annealing the microcrystalline silicon layer and the amorphous silicon layer to form the homogeneous polycrystalline silicon layer may include forming a blister-free homogeneous polycrystalline silicon layer. The above-described processes may be used in the fabrication of solar cells.

In another aspect of embodiments of the present disclosure, a PECVD process window allowing for reduced pattern spreading of silicon thin films deposited through a shadow mask is described. In an example, the above approaches, although describing patterning of a polycrystalline silicon film, may be implemented using a shadow mask to provide patterned silicon regions for use as emitter regions of a solar cell.

To provide context, using state-of-the-art approaches to patterning silicon using a shadow mask deposition approach often involves a lack of control over width and sharpness of the deposited pattern of silicon thin films. The control of pattern width is critical for alignment of emitters and thus, for efficiency of the final device. Embodiments described herein may address such issues by fine tuning a PECVD process to mitigate spreading. In one such embodiment, spreading is controlled by tuning plasma and surface chemistry. For example, physical vapor deposition "PVD"-like process conditions (e.g., high power, low pressure) can be implemented to provide a more directional deposition. Furthermore, surface chemistry may be provided to limit deposition below a mask. In a specific embodiment, spreading is controlled by tuning plasma and surface chemistry during micro-crystalline silicon PECVD processing to reduce spreading to less than 6% of the pattern width per side by utilizing both mechanisms. The microcrystalline silicon may be deposited at high power and low pressure, and surface diffusion of H radicals below the mask limits the deposition due to an etching effect.

Figure 8:
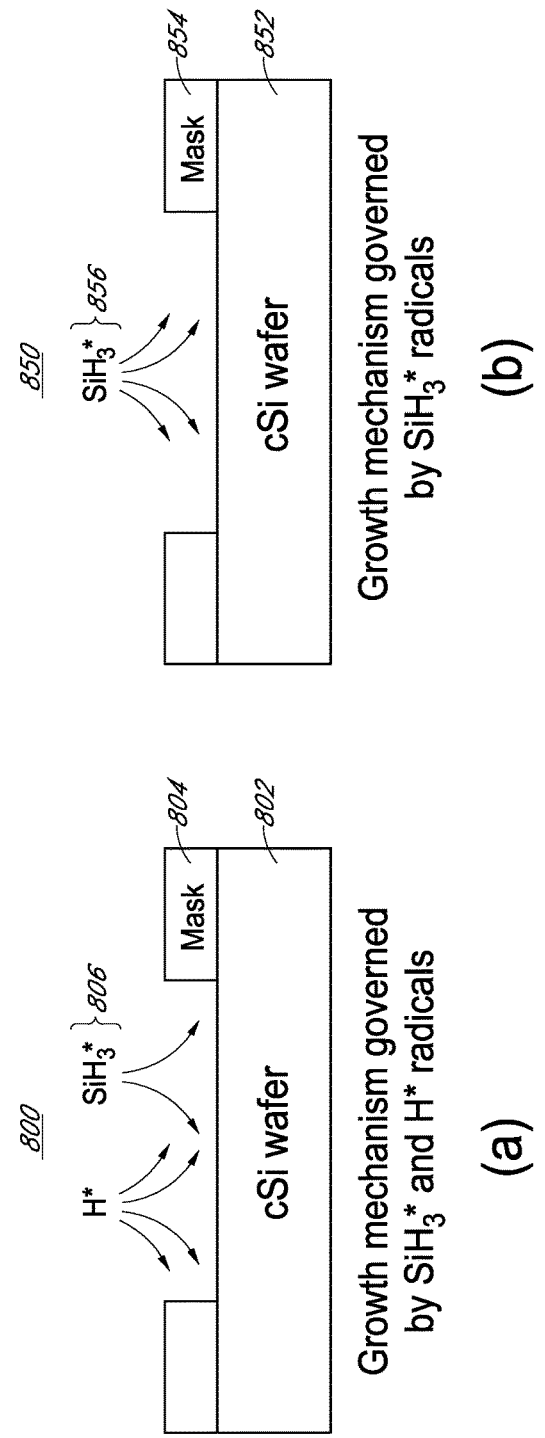
FIG. 8 schematically illustrates cross-sectional view of a deposition process that (a) limits mask pattern spreading, in accordance with an embodiment of the present disclosure as compared to (b) other approaches plagued by mask pattern spreading.

To illustrate the concepts involved, FIG. 8 schematically illustrates cross-sectional view of a deposition process that (a) limits mask pattern spreading, in accordance with an embodiment of the present disclosure as compared to (b) other approaches plagued by mask pattern spreading.

Referring to part (a) of FIG. 8, a processing scheme 800 involves use of a substrate 802 having a mask 804 there above. The substrate 802 may be a crystalline silicon wafer with or without a thin dielectric layer formed thereon. The mask 804 may be spaced above the substrate 802. A deposition chemistry 806 involves H* radicals and SiH$_3$* radicals. The growth mechanism of a microcrystalline silicon layer is governed by the H* radicals and SiH$_3$* radicals. In one instance, any spreading may be approximately 28 microns per side during a shadow mask deposition process.

In an embodiment, the microcrystalline silicon layer is formed using deposition conditions including a pressure of less than approximately 1.5 Torr, and a power of greater than approximately 0.15 W/cm$^2$. These conditions allow for an increased directional deposition (e.g., due to higher voltage bias in the plasma sheath). In an embodiment, a high hydrogen dilution is implemented (e.g., less than approximately 2% silane in hydrogen) to reduce material deposition below the mask 804. The reduced deposition below the mask may be due to an etching effect of the H radicals. In an embodiment, the microcrystalline silicon layer is formed using an addition of doping gases (such as phosphine or diborane) in the gas mixture for the PECVD process for deposition of a doped silicon thin film.

By contrast, referring to part (b) of FIG. 8, a processing scheme 850 involves use of a substrate 852 having a mask 854 there above. The substrate 852 may be a crystalline silicon wafer with or without a thin dielectric layer formed thereon. The mask 854 may be spaced above the substrate 852. A deposition chemistry 856 involves SiH$_3$* radicals. The growth mechanism of an amorphous silicon layer is governed by the SiH$_3$* radicals. In one instance, the spreading is severe at approximately 75 microns per side during a shadow mask deposition process.

Overall, although certain materials are described specifically above, some materials may be readily substituted with other materials, with such embodiments remaining within the spirit and scope of embodiments of the present disclosure. For example, in an embodiment, a different material substrate, such as a group III-V material substrate, can be used instead of a silicon substrate. Furthermore, it is to be understood that, where N+ and P+ type doping is described specifically, other embodiments contemplated include the opposite conductivity type, e.g., P+ and N+ type doping, respectively. Furthermore, it is to be appreciated that a silicidation approach that can be used in place of an aluminum seed layer for contact formation may also be applicable to front contact solar cells.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A back contact solar cell, comprising:
   a substrate having a light-receiving surface and a back surface;
   a first polycrystalline silicon emitter region of a first conductivity type disposed on a first thin dielectric layer disposed on the back surface of the substrate;
   a second polycrystalline silicon emitter region of a second, different, conductivity type disposed on a second thin dielectric layer disposed on the back surface of the substrate, a portion of the second polycrystalline silicon emitter region further formed over a portion of the first polycrystalline silicon emitter region, wherein the second polycrystalline silicon emitter region is a blister-free polycrystalline silicon emitter region of the second conductivity type;
   a third thin dielectric layer disposed laterally directly between the first and second polycrystalline silicon emitter regions;
   a first conductive contact structure disposed on the first polycrystalline silicon emitter region; and
   a second conductive contact structure disposed on the second polycrystalline silicon emitter region.

2. The back contact solar cell of claim 1, wherein the first polycrystalline silicon emitter region is a blister-free polycrystalline silicon emitter region of the first conductivity type.

3. The back contact solar cell of claim 1, further comprising:
   an insulator layer disposed on the first polycrystalline silicon emitter region, wherein the first conductive contact structure is disposed through the insulator layer, and wherein a portion of the second polycrystalline silicon emitter region overlaps the insulator layer but is separate from the first conductive contact structure.

4. The back contact solar cell of claim 1, further comprising:
   an insulator layer disposed on the first polycrystalline silicon emitter region; and
   a polycrystalline silicon layer of the second conductivity type disposed on the insulator layer, wherein the first conductive contact structure is disposed through the polycrystalline silicon layer of the second conductivity type and through the insulator layer.

5. The back contact solar cell of claim 1, wherein the second polycrystalline silicon emitter region and the second thin dielectric layer are disposed in a recess disposed in the substrate.

6. The back contact solar cell of claim 5, wherein the recess has a texturized surface.

7. The back contact solar cell of claim 1, wherein the first polycrystalline silicon emitter region and the first thin dielectric layer are disposed on a flat portion of the back surface of the substrate, and wherein the second polycrystalline silicon emitter region and the second thin dielectric layer are disposed on a texturized portion of the back surface of the substrate.

8. The back contact solar cell of claim 1, wherein the first and second conductive contact structures each comprises an aluminum-based metal seed layer disposed on the first and second polycrystalline silicon emitter regions, respectively, and each further comprises a metal layer disposed on the aluminum-based metal seed layer.

9. A back contact solar cell, comprising:
   a substrate having a light-receiving surface and a back surface;
   a first polycrystalline silicon emitter region of a first conductivity type disposed on a first thin dielectric layer disposed on the back surface of the substrate, wherein the first polycrystalline silicon emitter region is a blister-free polycrystalline silicon emitter region of the first conductivity type;
   a second polycrystalline silicon emitter region of a second, different, conductivity type disposed on a second thin dielectric layer disposed on the back surface of the substrate, a portion of the second polycrystalline silicon emitter region further formed over a portion of the first polycrystalline silicon emitter region;
   a third thin dielectric layer disposed laterally directly between the first and second polycrystalline silicon emitter regions;
   a first conductive contact structure disposed on the first polycrystalline silicon emitter region; and
   a second conductive contact structure disposed on the second polycrystalline silicon emitter region.

10. The back contact solar cell of claim 9, further comprising:
    an insulator layer disposed on the first polycrystalline silicon emitter region, wherein the first conductive contact structure is disposed through the insulator layer, and wherein a portion of the second polycrystalline silicon emitter region overlaps the insulator layer but is separate from the first conductive contact structure.

11. The back contact solar cell of claim 9, further comprising:
an insulator layer disposed on the first polycrystalline silicon emitter region; and
a polycrystalline silicon layer of the second conductivity type disposed on the insulator layer, wherein the first conductive contact structure is disposed through the polycrystalline silicon layer of the second conductivity type and through the insulator layer.

12. The back contact solar cell of claim 9, wherein the second polycrystalline silicon emitter region and the second thin dielectric layer are disposed in a recess disposed in the substrate.

13. The back contact solar cell of claim 12, wherein the recess has a texturized surface.

14. The back contact solar cell of claim 12, wherein the first polycrystalline silicon emitter region and the first thin dielectric layer are disposed on a flat portion of the back surface of the substrate, and wherein the second polycrystalline silicon emitter region and the second thin dielectric layer are disposed on a texturized portion of the back surface of the substrate.

15. The back contact solar cell of claim 9, wherein the first and second conductive contact structures each comprises an aluminum-based metal seed layer disposed on the first and second polycrystalline silicon emitter regions, respectively, and each further comprises a metal layer disposed on the aluminum-based metal seed layer.

16. A back contact solar cell, comprising:
a substrate having a light-receiving surface and a back surface;
a first polycrystalline silicon emitter region of a first conductivity type disposed on a first thin dielectric layer disposed on the back surface of the substrate, wherein the first polycrystalline silicon emitter region is a blister-free polycrystalline silicon emitter region of the first conductivity type;
a second polycrystalline silicon emitter region of a second, different, conductivity type disposed on a second thin dielectric layer disposed on the back surface of the substrate, a portion of the second polycrystalline silicon emitter region further formed over a portion of the first polycrystalline silicon emitter region, wherein the second polycrystalline silicon emitter region is a blister-free polycrystalline silicon emitter region of the second conductivity type;
a third thin dielectric layer disposed laterally directly between the first and second polycrystalline silicon emitter regions;
a first conductive contact structure disposed on the first polycrystalline silicon emitter region; and
a second conductive contact structure disposed on the second polycrystalline silicon emitter region, wherein the first and second conductive contact structures each comprises an aluminum-based metal seed layer disposed on the first and second polycrystalline silicon emitter regions, respectively, and each further comprises a metal layer disposed on the aluminum-based metal seed layer.

17. The back contact solar cell of claim 16, further comprising:
an insulator layer disposed on the first polycrystalline silicon emitter region, wherein the first conductive contact structure is disposed through the insulator layer, and wherein a portion of the second polycrystalline silicon emitter region overlaps the insulator layer but is separate from the first conductive contact structure.

18. The back contact solar cell of claim 16, further comprising:
an insulator layer disposed on the first polycrystalline silicon emitter region; and
a polycrystalline silicon layer of the second conductivity type disposed on the insulator layer, wherein the first conductive contact structure is disposed through the polycrystalline silicon layer of the second conductivity type and through the insulator layer.

19. The back contact solar cell of claim 16, wherein the second polycrystalline silicon emitter region and the second thin dielectric layer are disposed in a recess disposed in the substrate.

20. The back contact solar cell of claim 16, wherein the first polycrystalline silicon emitter region and the first thin dielectric layer are disposed on a flat portion of the back surface of the substrate, and wherein the second polycrystalline silicon emitter region and the second thin dielectric layer are disposed on a texturized portion of the back surface of the substrate.

* * * * *